(12) United States Patent
Wang et al.

(10) Patent No.: US 7,635,637 B2
(45) Date of Patent: Dec. 22, 2009

(54) SEMICONDUCTOR STRUCTURES FORMED ON SUBSTRATES AND METHODS OF MANUFACTURING THE SAME

(75) Inventors: Qi Wang, West Jordan, UT (US); Minhua Li, Sandy, UT (US); Jeffrey H. Rice, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/189,163

(22) Filed: Jul. 25, 2005

(65) Prior Publication Data

US 2007/0020884 A1 Jan. 25, 2007

(51) Int. Cl.
*H01L 21/30* (2006.01)
*H01L 21/46* (2006.01)

(52) U.S. Cl. ............... 438/458; 438/517; 257/E21.568

(58) Field of Classification Search ............... 438/455, 438/458, 459, 514, 517, 522, 530, FOR. 104–106, 438/FOR. 424; 257/E21.561, E21.567, E21.568
See application file for complete search history.

(56) References Cited

U.S. PATENT DOCUMENTS

| | | | |
|---|---|---|---|
| 4,616,408 A * | 10/1986 | Lloyd ........................... 29/611 |
| 5,344,524 A * | 9/1994 | Sharma et al. ............... 438/459 |
| 5,374,564 A | 12/1994 | Bruel |
| 5,391,257 A * | 2/1995 | Sullivan et al. .............. 438/458 |
| 5,455,202 A * | 10/1995 | Malloy et al. ................ 438/118 |
| 5,494,835 A | 2/1996 | Bruel |
| 5,714,395 A | 2/1998 | Bruel |
| 5,811,348 A * | 9/1998 | Matsushita et al. .......... 438/455 |
| 5,877,070 A | 3/1999 | Goesele et al. |
| 5,882,987 A | 3/1999 | Srikrishnan |
| 6,033,489 A | 3/2000 | Marchant et al. |
| 6,140,210 A * | 10/2000 | Aga et al. .................... 438/458 |
| 6,372,608 B1 * | 4/2002 | Shimoda et al. ............. 438/455 |
| 6,391,744 B1 | 5/2002 | Hudak et al. |
| 6,392,290 B1 | 5/2002 | Kasem et al. |

(Continued)

OTHER PUBLICATIONS

Bruel, M.; "Silicon on inInsulator Material Technology"; 1995, *Electronic Letters*, vol. 31, No. 14, pp. 1201-1202.

(Continued)

*Primary Examiner*—Matthew Smith
*Assistant Examiner*—Quovaunda Jefferson
(74) *Attorney, Agent, or Firm*—Townsend and Townsend and Crew LLP

(57) ABSTRACT

Processes used to transfer semiconductor structures from an initial substrate to a base substrate include bonding the initial substrate with a silicon dioxide layer to a doped silicon structure weakened sufficiently by hydrogen implantation for cleaving. After cleaving, a doped silicon layer remains, burying the silicon dioxide layer between the doped silicon layer and the initial substrate. Semiconductor structures are formed within/on an epitaxial layer disposed on the doped silicon layer forming an intermediate semiconductor structure. A process handle is temporarily bonded to the semiconductor structures for support. The initial substrate is thinned and removed by a mechanical thinning process followed by chemical etching using the buried silicon dioxide layer as an etch stop. The silicon dioxide layer is chemically removed from the doped silicon layer. A base substrate is formed on the doped silicon layer. The process handle is removed leaving the semiconductor structures disposed on the base substrate.

25 Claims, 4 Drawing Sheets

U.S. PATENT DOCUMENTS

| | | | |
|---|---|---|---|
| 6,429,481 B1 | 8/2002 | Mo et al. | |
| 6,455,398 B1 * | 9/2002 | Fonstad et al. | 438/459 |
| 6,468,923 B1 | 10/2002 | Yonehara et al. | |
| 6,500,732 B1 * | 12/2002 | Henley et al. | 438/459 |
| 6,635,534 B2 | 10/2003 | Madson | |
| 6,713,813 B2 | 3/2004 | Marchant | |
| 6,828,195 B2 | 12/2004 | Mo et al. | |
| 2003/0183876 A1 * | 10/2003 | Takafuji et al. | 257/347 |
| 2004/0140479 A1 * | 7/2004 | Akatsu | 257/190 |
| 2005/0017291 A1 | 1/2005 | Hirler | |
| 2005/0167742 A1 | 8/2005 | Challa et al. | |
| 2008/0261379 A1 * | 10/2008 | Jinbo et al. | 438/458 |

OTHER PUBLICATIONS

Celler, C.K. et al.; "Frontiers of Silicon-on-Insulator"; 2003, *Journal of Applied Physics*, vol. 93, No. 9, pp. 4955-4978.

Tong, Q.Y. et al.; "Layer splitting process in hydrogen-implanted Si, Ge, SiC, and diamond substrates"; 1997, *Appl. Phys. Lett.*, vol. 70, No. 11, pp. 1390-1392.

Tong, Q.Y. et al.; "Layer Transfer by Bonding and Layer Splitting"; 1999, *The Electronchemical Society Series*, pp. 161-165.

* cited by examiner

SEMICONDUCTOR STRUCTURES FORMED ON SUBSTRATES AND METHODS OF MANUFACTURING THE SAME

BACKGROUND OF THE INVENTION

The present invention relates in general to semiconductor devices and in particular to various embodiments of semiconductor structures formed on various substrates such as metal and methods of manufacturing such devices.

Generally, conventional semiconductor manufacturing utilizes a number of processes to form semiconductor structures on substrates. The substrate is typically part of a wafer. A wafer is a small thin circular slice of a semiconducting material, such as silicon, on which semiconductor structures are formed. Standard device fabrication processes, such as etching, deposition, and plating are used to fabricate semiconductor structures on the wafer. After the formation of the semiconductor structures, the wafer is tested and then diced up to separate individual semiconductor structures, generally called dies, which include a substrate layer. A substrate layer (substrate) is often referred to as the base layer or body of the die onto which other layers are deposited to form the semiconductor structures. Semiconductor structures formed on the substrate may be discrete devices or integrated circuits. For example, the semiconductor structure may be composed of a single discrete power transistor, or may be formed from a number of transistors and other electronic elements, such as resistors, capacitors, etc., that are electrically coupled together to form an integrated circuit.

The substrate plays a critical role with the semiconductor structures it supports whether it is a discrete device, such as a power transistor, or an integrated circuit. The substrate is often used to structurally support the semiconductor structure from damage due to mechanical flexing. The substrate may also be used as part of the semiconductor structure, supporting vertical or lateral current flows. In some devices, the substrate is used as an insulator where the substrate is configured to insulate the semiconductor structure from other semiconductor structures or from electronically coupling to a conductive surface.

Depending on its properties and dimensions, a substrate may adversely impact the performance of semiconductor structures it supports. The substrate may introduce unwanted parasitic impedances and heat conduction paths that can affect the power consumption, the power dissipation, and the operational bandwidth of a semiconductor structure. For example, in the case of a typical complementary metal oxide semiconductor (CMOS) integrated circuit, the substrate may contribute to latch-up. Placing the CMOS devices on an insulating substrate e.g., silicon-on-insulator (SOI) instead of a conducting substrate can reduce current leakage and help prevent latch-up, however, the insulating substrate also may limit the heat conduction from the CMOS circuitry. For radio frequency (RF) devices, the substrate is often a critical design element with respect to transmission lines used to transmit high speed data. The thickness and type of substrate material is important to the transmission efficiency of such high speed signals. The substrate often plays a key role in the heat dissipation of the semiconductor structure. For example, a metal substrate may be used to help draw heat from a device to an external environment. Therefore, the thickness, material, and structural design of the substrate layer are critical components of the performance and structural integrity of the semiconductor structure it supports.

In certain devices, the substrate is used as part of the current conduction path. For example, the substrate plays an important role with the solid state switch which is a key semiconductor structure used for discrete device applications and integrated circuits. Solid state switches include, for example, the power metal-oxide-semiconductor field effect transistor (power MOSFET), the insulated-gate bipolar transistor (IGBT) and various types of thyristors. Some of the defining performance characteristics for the power switch are its on-resistance (i.e., drain-to-source on-resistance, $R_{DSon}$), breakdown voltage, and switching speed. Depending on the requirements of a particular application, a different emphasis is placed on each of these performance criteria. For example, for power applications greater than about 300-400 volts, the IGBT exhibits an inherently lower on-resistance as compared to the power MOSFET, but its switching speed is lower due to its slower turn off characteristics. Therefore, for applications greater than 400 volts with low switching frequencies requiring low on-resistance, the IGBT is the preferred switch while the power MOSFET is often the device of choice for relatively higher frequency applications.

Generally, the switching speed, on-resistance, breakdown voltage, and power dissipation of a typical MOSFET device is influenced by the layout, dimensions, and materials. Industry design practice has sought to keep the on-resistance of the MOSFET as low as possible to lower static power loss and increase current densities. For example, in vertical power MOSFET devices, the on-resistance is composed of several resistances such as channel resistance, epitaxial layer resistance, and substrate resistance. The on-resistance of such a vertical power MOSFET device (as well as other MOSFET devices) is directly influenced by the type and dimensions of materials used to form the drain to source conduction path. Therefore, for a vertical power MOSFET, the substrate is a critical performance element.

In addition to the substrate layer, the semiconductor layers forming semiconductor structures such as MOSFETs and CMOS circuitry inherently impart an influence on the operational performance of the semiconductor structures. The substrate layer and semiconductor layers introduce parasitic effects, that are inherent in the substrate and semiconductor layers, to the semiconductor structures. For example, parasitic capacitances and inductances are directly affected by the materials used for the semiconductor layers and substrate (e.g., insulator, semiconductor, doping concentration, etc.) and the dimensions (e.g., height, width, length, etc.) used to form and support the semiconductor structures. Such parasitic effects generally lead to a degradation of the semiconductor structure electrical performance and operation.

Generally, smaller dimensions in semiconductor structures tend to reduce parameters such as resistance, power dissipation, and parasitic impedance. With regard to the semiconductor layers, for example, the thinner the semiconductor layers the better the semiconductor structure frequency of operation. Also, larger specific heat capacitance and more heat capacitive substrate materials tend to increase the heat dissipation ability of the semiconductor structures, whereas thinner substrates tend to improve frequency of operation for those devices that rely on the substrate as part of the conduction path. However, as semiconductor structures decrease in size, providing thinner semiconductor layers and substrates presents process challenges for semiconductor manufacturers. In conventional semiconductor structure fabrication processes, after semiconductor structures, other semiconductor layers, and metal layers have been applied to the substrate, the substrate is often thinned using a process such as chemical mechanical polishing (CMP). Chemical etching processes have been developed to further etch the substrate to a thinner profile, but chemical etching process are difficult to control and often lead to damaged semiconductor structures that are inadvertently etched during the process. In addition, conventional substrate thinning processes have inherit limitations as the semiconductor structures require some structural support. Therefore, conventional processes to thin the substrate generally produce some defective semiconductor structures due to etching errors and the mechanical flexing of the substrate.

There is therefore a need for structures and methods to form semiconductor structures with optimized semiconductor layers and substrates to improve operational performance while minimizing process related defects due to structural stresses.

BRIEF SUMMARY OF THE INVENTION

Embodiments of the present invention pertain to a formation of semiconductor structures and a process of transferring semiconductor structures formed in and/or on silicon layers, disposed on an initial substrate, to a base substrate such as metal, silicon, glass, and the like. In one embodiment, the present invention discloses methods and structures used to transfer discrete devices and integrated circuits from the initial substrate layer to a base substrate. The processes and structures described herein provide semiconductor layers and substrates with improved electrical and structural performance which provide for improved electrical performance of the semiconductor structures integral to and supported by the semiconductor layers and substrates.

In another embodiment, the invention provides a method of transferring semiconductor structures from an initial substrate to a base substrate. The method includes providing an initial substrate with an etch stop layer, providing a doped silicon layer on the etch stop layer, and forming semiconductor structures on the doped silicon layer. The semiconductor structures, the doped silicon layer, the etch stop layer, and the initial substrate form a semiconductor process. The method further includes supporting the semiconductor process with a removable support structure, removing the initial substrate using a chemical etching process that removes the initial substrate up to the etch stop layer, removing the etch stop layer with a chemical etching process, and depositing a substrate material on the doped silicon layer to form the base substrate.

In another embodiment, the present invention provides a method of forming semiconductor structures on a metal substrate. The method includes providing an initial substrate with an exposed silicon dioxide etch stop layer, bonding a hydrogen implanted doped silicon material to the silicon dioxide etch stop layer, determining a region of the doped silicon material sufficiently weakened by the hydrogen to allow cleaving the doped silicon material along the region, and cleaving the doped silicon material along the region leaving a doped silicon layer bonded to the silicon dioxide layer. The method further includes forming semiconductor structures on the doped silicon layer, supporting the semiconductor structures, silicon dioxide layer, and initial substrate with a supporting device, removing the initial substrate, removing the silicon dioxide layer, and providing a sufficient amount of metal to the doped silicon layer to form a metal substrate.

In another embodiment, the invention provides a substrate structure. The substrate structure includes an etch stop layer disposed on an initial substrate. The etch stop layer is configured to provide a processing barrier to a chemical mechanical polishing process for removing the initial substrate. The substrate structure also includes a semiconductor layer disposed on the etch stop layer.

DETAILED DESCRIPTION OF THE INVENTION

The present invention pertains to semiconductor structures and processes for transferring semiconductor structures formed in and/or on silicon layers formed on an initial substrate, such as an initial substrate for a power MOSFET, to a base substrate such as metal, glass, silicon, and the like. The present invention also pertains to transferring semiconductor structures formed in and/or on silicon layers formed on an initial substrate to an insulator for silicon-on-insulator (SOI) devices. The process includes forming a layer of silicon dioxide ($SiO_2$) on the initial substrate. The process further includes providing a doped silicon layer on the $SiO_2$ layer. A doped semiconductor material is implanted with hydrogen ions (e.g., H+) to form a cleavable region. The doped silicon material is bonded to the $SiO_2$ layer. The hydrogen concentration in the cleavable region is sufficient to allow the doped silicon material to be cleaved. In one embodiment, the doped silicon material is annealed at a temperature sufficient to cleave the cleavable region. After cleaving, a layer of doped silicon material remains on the $SiO_2$ layer burying the $SiO_2$ layer between the substrate and the doped silicon layer. An epitaxial layer is formed on the doped silicon layer. Semiconductor structures are formed within and/or on the epitaxial layer using conventional semiconductor structure formation processes forming a semiconductor structure layer (i.e., a layer containing electronic elements such as discrete transistors, integrated circuits, and the like). The substrate, doped silicon layer, $SiO_2$ layer, epitaxial layer, and semiconductor structure layer form an intermediate semiconductor structure body. The method further includes attaching a support structure to the semiconductor structures to support the intermediate semiconductor process structure for further processing. Once the intermediate semiconductor process structure is supported, the initial substrate is removed using a mechanical grinding process followed by a chemical etching process using the buried $SiO_2$ layer as an etch stop layer. The $SiO_2$ layer is then removed using a chemical etch process. The doped silicon layer, epitaxial layer, and semiconductor structures form a second intermediate semiconductor process structure. A base substrate layer such as metal is then formed on the doped silicon layer of sufficient thickness to form the base substrate. The base substrate, doped silicon layer, epitaxial layer, and semiconductor structures form a final semiconductor process structure. In another process step, the final semiconductor process structure may be diced and packaged into one or more semiconductor structures, e.g., dies. In one embodiment, metal such as copper is used as the substrate formed on the doped silicon layer.

Figure 1:
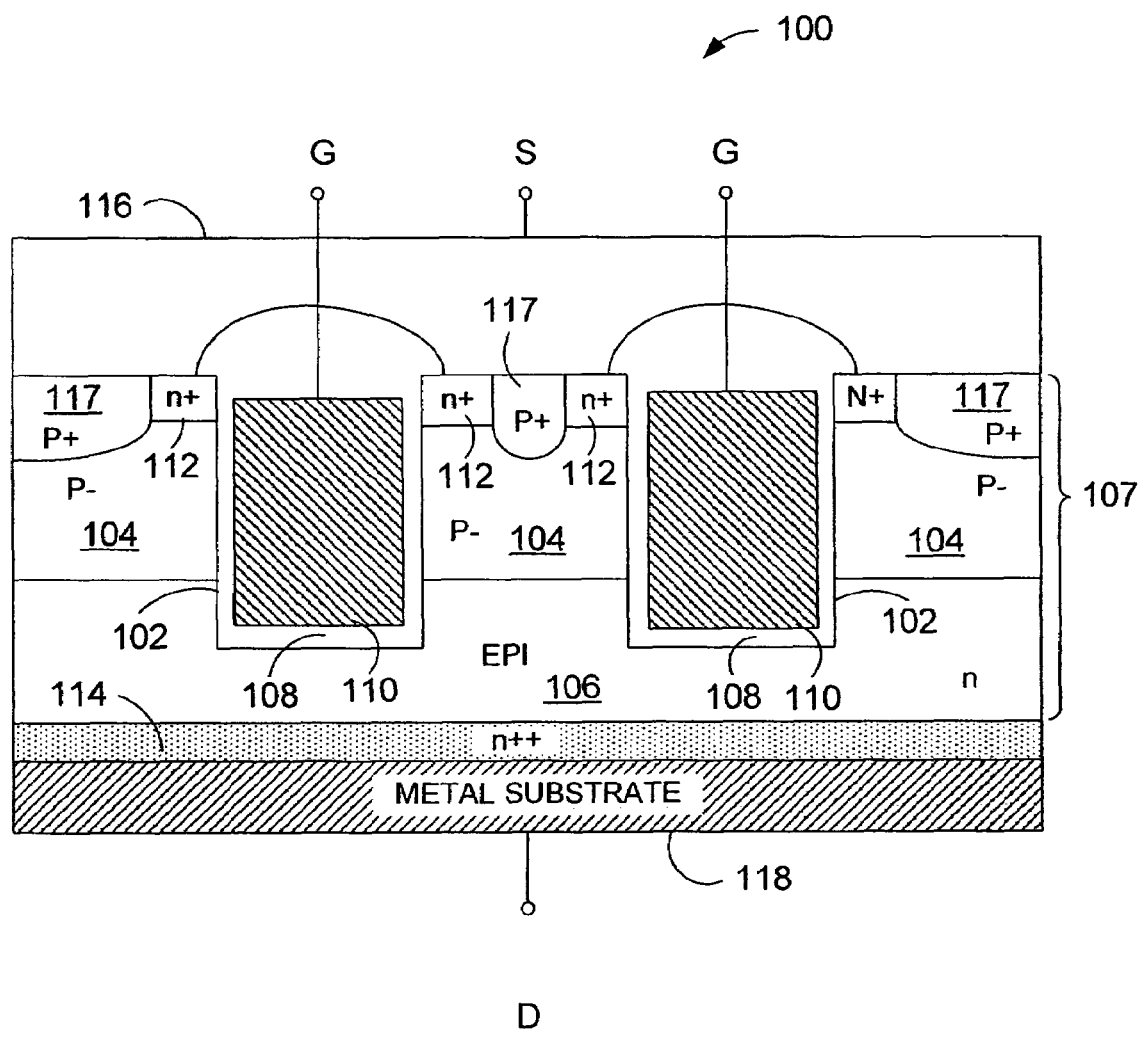
FIG. 1 illustrates a cross-sectional view of one embodiment of an exemplary n-type trench MOSFET in accordance with embodiments of the invention.

To better understand the exemplary process flow described above, the invention will be described in greater detail in the context of vertical power MOSFET of the type shown in FIG. 1. FIG. 1. illustrates a cross-sectional view of one embodiment of an exemplary n-type trench MOSFET 100. It is to be understood, however, that the principle techniques of the present invention apply to both discrete devices as well as integrated circuits using any processing technology. As with all other figures described herein, it is to be understood that the relative dimensions and sizes of various elements and components depicted in the figures do not exactly reflect actual dimensions and are for illustrative purposes only. MOSFET 100 includes a gate electrode G that is formed inside trenches 102. The trenches 102 extend from the top surface of a p-well body region 104 terminating in an n-type drift or epitaxial region 106. In one embodiment, the trenches 102 are lined with thin dielectric layers 108 and are substantially covered with conductive material 110, such as doped polysilicon. N-type source regions 112 are formed inside the p- well body region 104 adjacent trenches 102. MOSFET 100 includes a p+ body region 117 formed inside the p- well body region 104. MOSFET 100 includes a metal source layer 116. A drain terminal D for MOSFET 100 is coupled to a metal substrate 118 disposed on a doped silicon layer 114. The epitaxial layer 106 and body region 104 form a semiconductor structure layer 107 disposed on the doped silicon layer 114. The structure of FIG. 1 is repeated many times to form an array of transistors. A number of different power devices with various improvements are described in greater detail in commonly assigned U.S. patent application Ser. No. 11/026,276, entitled "Power Semiconductor Devices and Methods of Manufacture," which is hereby incorporated by reference in its entirety.

Although conventional vertical trench MOSFETs exhibit good on-resistance, they generally have a relatively high input capacitance. The input capacitance for vertical trench MOSFETs, including MOSFET 100, has two components: gate-to-source capacitance Cgs and gate-to-drain capacitance Cgd. The gate-to-source capacitance Cgs results from the overlap between gate conductive material 110 and source regions 112 near the top of the trench 102. The capacitance formed between the gate and the inverted channel in the body also contributes to Cgs since in typical power switching applications the body and source electrodes of the transistor are shorted together. The gate-to-drain capacitance Cgd results from the overlap between gate conductive material 110 at the bottom of each trench 102 and epitaxial layer 106 which connects to the metal substrate 118 though the doped silicon layer 114. The gate-to-drain capacitance Cgd, or Miller capacitance, limits the transistor $V_{DS}$ transition time. Therefore, higher Cgs and Cgd results in appreciable switching losses. These switching losses are becoming increasingly important as power management applications move toward higher switching frequencies.

One way to reduce the gate-to-source capacitance Cgs is to reduce the channel length of the transistor. A shorter channel length directly reduces the gate-to-channel component of Cgs. A shorter channel length is also directly proportional to on-resistance $R_{DSon}$ and enables obtaining the same device current capacity with fewer gate trenches. This reduces both Cgs and Cgd by reducing the amount of gate-to-source and gate-to-drain overlap. A shorter channel length, however, renders the device vulnerable to punch-through when the depletion layer formed as a result of the reverse-biased body-drain junction pushes deep into the body region and approaches the source regions. Decreasing the doping concentration of the epitaxial layer 106 so that it sustains more of the depletion layer has the undesirable effect of increasing the $R_{DSon}$ of the transistor.

In one embodiment, device on-resistance can be reduced by reducing the thickness of the semiconductor structure layer 107. For example, reducing the thickness of the semiconductor structure layer 107 decreases channel length. In one embodiment, a lower Cgd is also provided by providing a relatively thin doped silicon layer 114 on the metal substrate 118. The metal substrate 118 also provides structural support for the transistor structure. With the processes described herein, the semiconductor structure layer 107 and doped silicon layer 114 may be sized considerably thinner than conventional transistor configurations. For example, the drift region may be about 7.5 micrometers (um) of the overall thickness of the semiconductor structure layer 107 of about 10 um, including device region 104. In addition, as there is no thick initial substrate to contend with, the epitaxial layer 106 may be doped with a predetermined doping profile and formed with a reduced thickness to maintain an acceptable voltage punch-through immunity while decreasing $R_{DSon}$.

Figure 2:
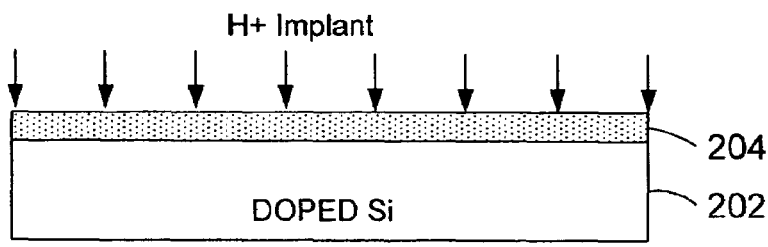
FIG. 2 illustrates a cross-sectional view of one embodiment of a silicon material with a region implanted with hydrogen ions in accordance with embodiments of the invention.
Figure 3:
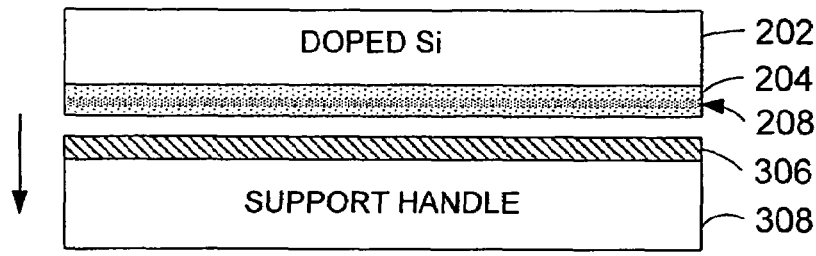
FIG. 3 illustrates a cross-sectional view of one embodiment of an initial substrate and the doped silicon material in accordance with embodiments of the invention.

FIG. 2 illustrates a cross-sectional view of one embodiment of a doped silicon material 202 with a region 204 implanted with hydrogen ions (H+) and FIG. 3 illustrates a cross-sectional view of one embodiment of an initial substrate (e.g. a support handle) 308 and the doped silicon material 202 in accordance with embodiments of the invention. Referring now to FIG. 2, the doped silicon material 202 may be doped by virtually any type of dopant such as Boron, Arsenic, and the like used to form semiconductor structures. In this example a dopant is used to form an n+ type material. To generate the layer of doped silicon 114, the doped silicon material 202 is doped with hydrogen ions to form the hydrogen rich region 204. An exemplary process for doping hydrogen ions into a silicon substrate is disclosed in U.S. Pat. No. 5,374,564, by Bruel, incorporated herein by reference in its entirety.

In one embodiment, the concentration of hydrogen ions is provided on the surface of the doped silicon 202 at a sufficient depth and energy potential to form a cleavable region 208 having an exemplary thickness of between about 1-2 um. For example, the doped silicon material 202 is doped with hydrogen ions at an energy level of 170 Kev to at a dose level of $5E16/cm^2$ hydrogen ions to form the cleavable region 208 with a thickness of about 1.7 um. Because of hydrogen embrittlement, the cleavable region 208 lattice is weaker than non-hydrogen doped silicon lattice.

The initial substrate 308 includes a silicon dioxide ($SiO_2$) layer 306. The $SiO_2$ layer 306 is used as an etch stop layer and may be virtually any thickness that may be used to advantage. For example, the $SiO_2$ layer 306 may be about between 2500 and 4000 angstroms. The $SiO_2$ layer 306 may be grown or deposited on the initial substrate 308 using virtually any $SiO_2$ layer formation process. For example, the $SiO_2$ layer 306 may be grown using a thermal oxidation process. In one configuration, the $SiO_2$ layer 306 may be formed on the initial substrate 308 and/or the $SiO_2$ layer 306 may be formed on the doped silicon material 202 on the surface of the region 204. The $SiO_2$ layer 306 is described further below.

Figure 4:
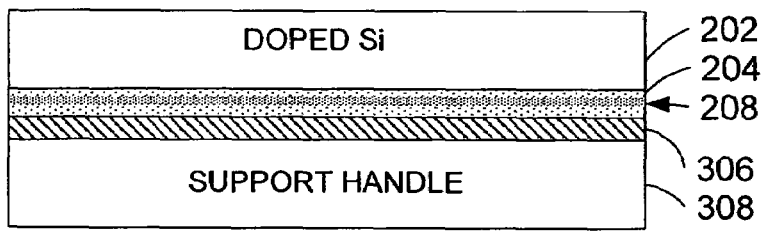
FIG. 4 illustrates a cross-sectional view of one embodiment of the initial substrate bonded to the doped silicon material of FIG. 3, in accordance with embodiments of the invention.
Figure 5:
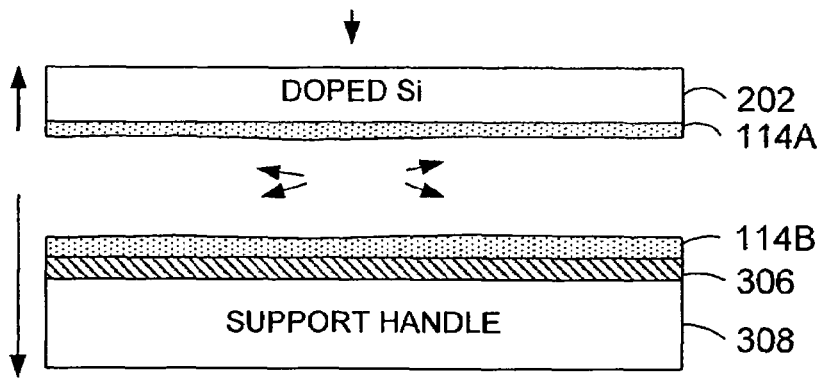
FIG. 5 illustrates a cross-sectional view of one embodiment of the initial substrate separated from the doped silicon material of FIG. 3 leaving a layer of doped silicon on the initial substrate, forming a semiconductor process structure, in accordance with embodiments of the invention.

FIG. 4 illustrates a cross-sectional view of one embodiment of the initial substrate 308 bonded to the doped silicon material 202 of FIG. 3. FIG. 5 illustrates a cross-sectional view of one embodiment of the initial substrate 308 separated (i.e., cleaved) from the doped silicon material 202 of FIG. 3 using a cleaving process. The cleaving process leaves a layer 114B of doped silicon on the initial substrate 308 and a remaining layer portion 114A of the hydrogen doped silicon on the doped silicon material 202. The $SiO_2$ layer 306 may be bonded to the doped silicon material 202 using a plurality of bonding techniques. For example, after a wet chemical and de-ionized (DI) water treatment to render the $SiO_2$ layer 306 and the doped silicon material with a hydrophilic surface, the $SiO_2$ layer 306 and the doped silicon material may be bonded, e.g., at room temperature using conventional bonding techniques. After the bonding process, the doped silicon material 202 is cleaved from the initial substrate 308 using any number of cleaving processes. In one embodiment, the cleaving process includes annealing the doped silicon material 202 and the initial substrate 308 at a temperature of between 200 and 300 degrees Celsius for about 5 hours to 10 hours. The cleaving process includes annealing the doped silicon material 202 and the initial substrate 308 at a temperature of about 450 degrees Celsius for about 15 minutes. The annealing process is used to break the lattice structure of the cleavable region 208.

Figure 6:
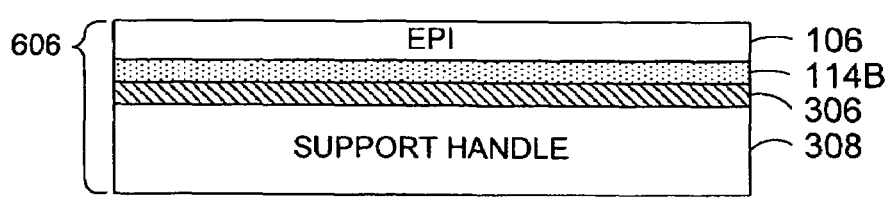
FIG. 6 illustrates a cross-sectional view of one embodiment of the semiconductor process structure of FIG. 5 with an epitaxial layer disposed on the doped silicon layer, in accordance with embodiments of the invention.
Figure 7:
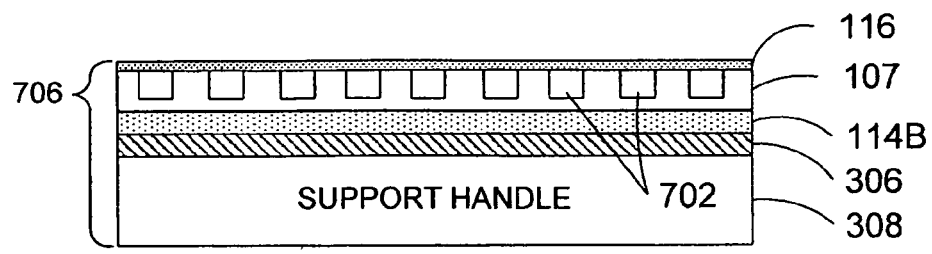
FIG. 7 illustrates a cross-sectional view of one embodiment of the semiconductor process structure of FIG. 6, with semiconductor structures formed on the epitaxial layer forming a semiconductor structure layer, in accordance with embodiments of the invention.

FIG. 6 illustrates a cross-sectional view of one embodiment of the semiconductor process structure of FIG. 5 with an epitaxial layer 106 disposed on the doped silicon layer 114B, and FIG. 7 illustrates a cross-sectional view of one embodiment of the semiconductor structure of FIG. 6, with semiconductor structure layer 107 having semiconductor structures 702, in accordance with embodiments of the invention. Optionally, the cleaved doped silicon layer 114B may be pretreated in a CVD chamber to prepare the doped silicon layer 114B for the epitaxial layer 106 formation. The CVD treatment may be used to generate a more uniform surface. The epitaxial layer 106 may be formed on the doped silicon layer 114B using a number of techniques. For example, the epitaxial layer 106 may be grown on the doped silicon layer 114B. Referring to FIG. 6, in one embodiment, the support handle 308, $SiO_2$ layer 306, doped silicon layer 114B, and epitaxial layer 106 form an intermediate semiconductor processing structure 606. The formation of the semiconductor structure layer 107 may be done by any conventional semiconductor structure formation technique. For example, the semiconductor structures 702 may be formed on and/or within the epitaxial layer 106 using conventional semiconductor structure fabrication steps such as layering, patterning, and doping. The semiconductor structures 702 may also be formed on the doped on and/or formed integral to the doped silicon layer 114B. In one optional operational configuration, for MOSFETs, for example, the metal layer 116 is formed on the semiconductor structures 702. The metal layer 116 may be applied using virtually any process some of which are described herein. In another embodiment, after the formation of the device layer 107, the initial substrate 308, $SiO_2$ layer 306, doped silicon layer 114B, and semiconductor structure layer 107 form another intermediate semiconductor processing structure 706.

Figure 8:
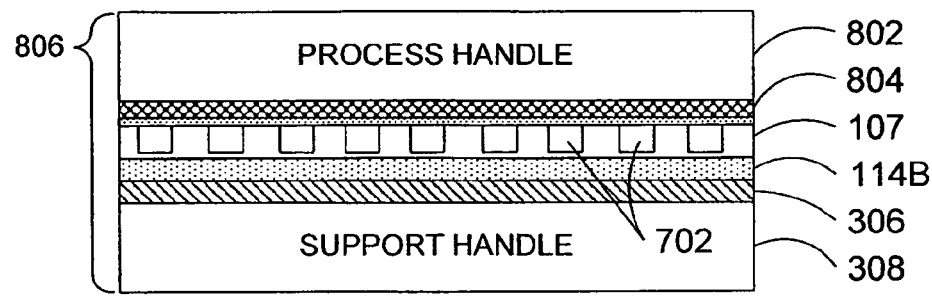
FIG. 8 illustrates a cross-sectional view of one embodiment of a process handle mounted to the semiconductor structure layer to support the semiconductor process structure for processing, in accordance with embodiments of the invention.

Referring now to FIG. 8 there is shown a cross-sectional view of one embodiment of a process handle 802 mounted to the semiconductor structure layer 107 to support the semiconductor process structure 706 for processing. In one embodiment, the process handle 802 is temporarily mounted to the semiconductor structure layer 107 to support the intermediate semiconductor process structure 706. For example, in one process step the process handle 802 is mounted to the semiconductor structures 702 using a UV releasable double sided tape 804. The tape 804 provides an adhesive bond sufficient in strength to securely hold the intermediate semiconductor process structure 706 for processing. In another embodiment, the initial substrate 308, $SiO_2$ layer 306, doped silicon layer 114B, semiconductor structure layer 107, tape 804, and process handle 802 form another intermediate semiconductor processing structure 806.

Figure 9:
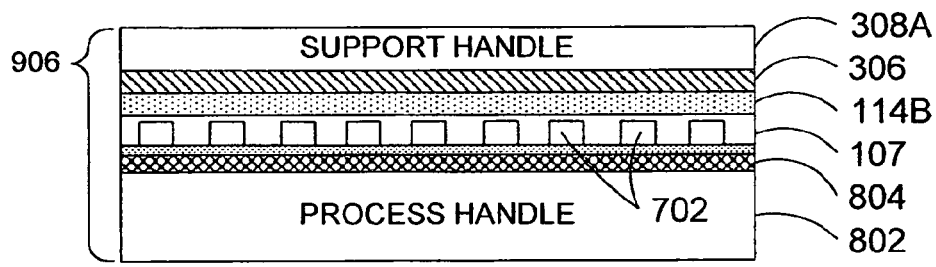
FIG. 9 illustrates a cross-sectional view of one embodiment of the semiconductor process structure after the initial substrate is thinned by a substrate thinning process, in accordance with embodiments of the invention.

FIG. 9 illustrates a cross-sectional view of one embodiment of the semiconductor process structure 706 after the initial substrate 308 is thinned by an substrate thinning process. Optionally, in one embodiment, the initial substrate 308 is thinned using a mechanical thinning process such as mechanical polishing/grinding to form a thinner substrate 308A. The initial substrate 308 may be thinned, e.g., to about 8 mils to make is faster to remove with chemicals. In another embodiment, the substrate 308A, $SiO_2$ layer 306, doped silicon layer 114B, and semiconductor structure layer 107 form another intermediate semiconductor processing structure 906.

Figure 10:
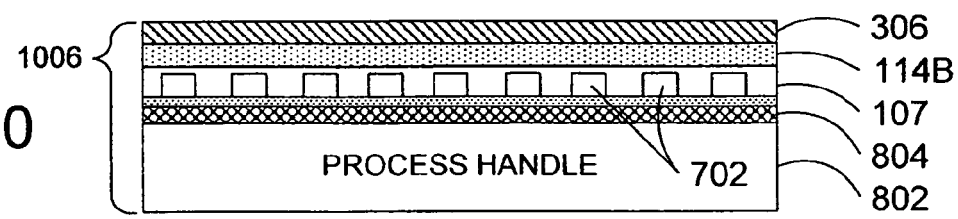
FIG. 10 illustrates a cross-sectional view of one embodiment of the semiconductor process structure after the initial substrate is removed by a substrate etching process, in accordance with embodiments of the invention.

FIG. 10 illustrates a cross-sectional view of one embodiment of the semiconductor processing structure after the initial substrate 308A is removed by a substrate etching process. In one process, the initial substrate 308A is removed by chemically etching the substrate 308A with a chemical etching process using the buried $SiO_2$ layer 306 as an etch stop layer. As the $SiO_2$ layer 306 is configured to stop the chemical etching process, the semiconductor structure layer 107 remains untouched by the chemical used to etch the initial substrate 308A. The chemical etching may be done by any process to remove the initial substrate 308A. For example, the etching process may be done with chemicals such as acid, hydroxides, and the like, that remove the initial substrate 308A, but do not etch the buried SiO₂ layer 306. In one process, the chemical etching process to remove the initial substrate 308A may be illustrated with the following chemical formula:

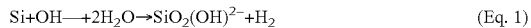
$$Si+OH^- + 2H_2O \rightarrow SiO_2(OH)^{2-} + H_2 \quad (Eq.\ 1)$$

Where $SiO_2(OH)^{2-}$ is a soluble complex. In another embodiment, after removing the thinned initial substrate 308A, the SiO₂ layer 306, doped silicon layer 114B, and semiconductor structure layer 107 form another intermediate semiconductor processing structure 1006.

Figure 11:
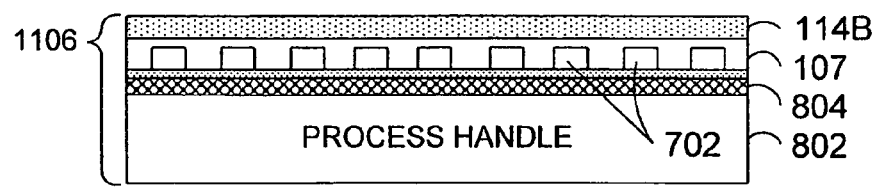
FIG. 11 illustrates a cross-sectional view of one embodiment of the semiconductor process structure after the etch stop layer is removed by an etching process, in accordance with embodiments of the invention.

FIG. 11 illustrates a cross-sectional view of one embodiment of the semiconductor process structure 1006 after the SiO₂ layer 306 is removed by an etching process. The buried SiO₂ layer 306 may be chemically etched using a solution of diluted HF. In this configuration, the doped silicon layer 114B is used as the etch stop. For example, the SiO₂ layer 306 may be etched with a 49 wt % HF solution at room temperature. This example solution may etch the SiO₂ layer 306 at about 2.5 um/min. The etching process for removing layer 306 can be illustrated with the following chemical equation:

$$SiO_2 + 6HF \rightarrow H_2SiF_6(aq) + 2H_2O \quad (Eq.\ 2)$$

In another embodiment, after etching the SiO₂ layer 306 away from the doped silicon layer 114B, the doped silicon layer 114B, semiconductor structure layer 107, tape 804, and process handle 802 form another intermediate semiconductor processing structure 1106.

Figure 12:
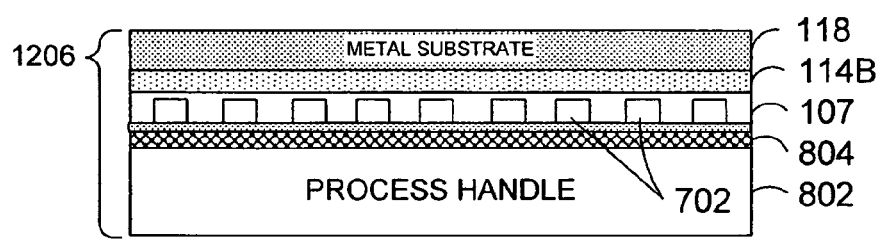
FIG. 12 illustrates a cross-sectional view of one embodiment of the semiconductor process structure after a metal substrate is formed on the doped silicon layer, in accordance with embodiments of the invention.

FIG. 12 illustrates a cross-sectional view of one embodiment of the semiconductor process structure 1106 after the metal substrate 118 is formed on the doped silicon layer 114. For clarity, forming a metal substrate 118 is described, however, it is to be understood that the base substrate formed may be virtually any type of material such as metal, glass, semiconductor, and the like that may be used to advantage. In one embodiment, the metal substrate 118 may be formed using virtually any process, such as electroplating and/or using deposition processes such as plasma vapor deposition (PVD), chemical vapor deposition (CVD), and the like. For example, the metal substrate 118 may be electroplated on the doped silicon layer 114. The metal substrate 118 may include virtually any metal or conductor that may be used to advantage such as copper, aluminum, or alloys such as solder, and the like. In one embodiment, after forming the metal substrate 118, the metal substrate 118, doped silicon layer 114B, semiconductor structure layer 107, tape 804, and process handle 802 form another intermediate semiconductor processing structure 1206.

Figure 13:
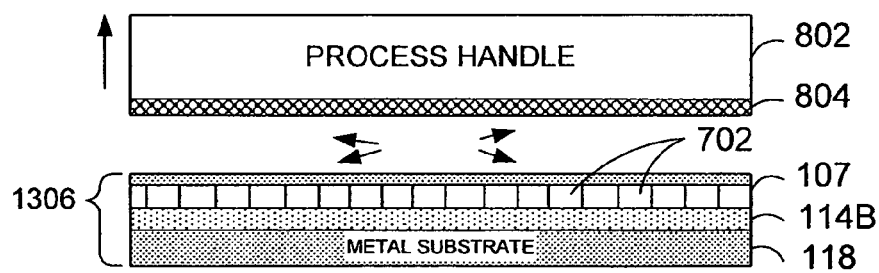
FIG. 13 illustrates a cross-sectional view of one embodiment of the semiconductor process structure after the process handle is removed from the semiconductor process structure, in accordance with embodiments of the invention.

FIG. 13 illustrates a cross-sectional view of one embodiment of the semiconductor process structure 1206 after the process handle 802 is removed from the semiconductor process structure 1206. The process handle 802 may be removed using any number of techniques. For example, the process handle 802 may be removed using an ultra violet light process where the tape 804 is configured to release when exposed to a sufficient amount of UV light for a predetermined duration. In one embodiment, after removing the process handle 802, the metal substrate 118, doped silicon layer 114B, and semiconductor structure layer 107 form another intermediate semiconductor processing structure 1306.

Figure 14:
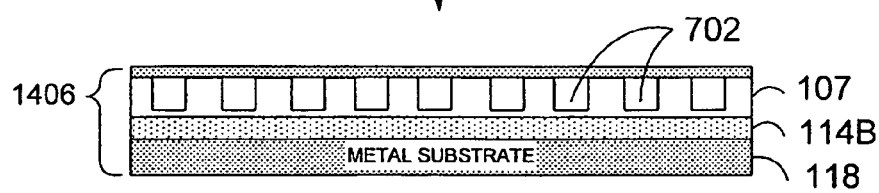
FIG. 14 illustrates a cross-sectional view of one embodiment of the semiconductor process structure prior to being diced, in accordance with embodiments of the invention.
Figure 15:
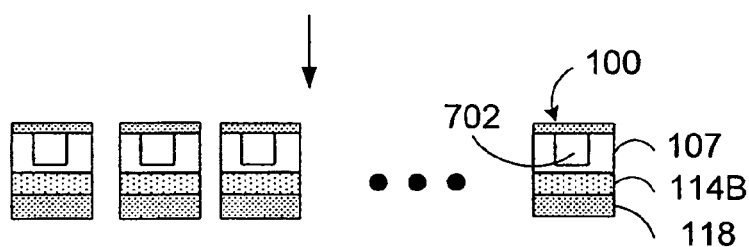
FIG. 15 illustrates a cross-sectional view of one embodiment of the semiconductor process structure after being diced into individual devices, in accordance with embodiments of the invention.

FIG. 14 illustrates a cross-sectional view of one embodiment of the semiconductor process structure 1406 prior to being diced, and FIG. 15 illustrates a cross-sectional view of one embodiment of the semiconductor process structure 1406 after being diced into individual devices (dies) such as MOSFET 100 in accordance with embodiments of the invention.

While the above provides a detailed description of various embodiments of the invention, many alternatives, modifications, and equivalents are possible. For example, many of the integrated formation techniques described herein in the context of a MOSFET, in particular a trench gated MOSFET, may be used for other types of process technologies to manufacture semiconductor structures such as bipolar or CMOS integrated circuits, etc. Those skilled in the art will appreciate that the same techniques can apply to other types of devices, including virtually all semiconductor structures associated with a substrate either as a process carrier or as part of the semiconductor structure body. For example, the processes described here may be used to transfer a CMOS integrated circuit from an initial substrate to an insulator. With regard to RF devices, the processes and structures described may be used to transfer an RF device and/or circuit to a substrate configured with a thickness and suitable dielectric to accommodate RF circuitry, such as an alumina-ceramic substrate. Furthermore, it is to be understood that all numerical examples and material types provided herein to describe various dimensions, energy levels, doping concentrations, different semiconducting or insulating layers are illustrative purposes only. For this and other reasons, therefore, the above description should not be taken as limiting the scope of the invention, which is defined by the appended claims.

What is claimed is:

1. A method of transferring semiconductor structures from an initial substrate to a base substrate, the method comprising:
providing an initial substrate with an etch stop layer;
providing a doped silicon layer on the etch stop layer;
after providing the doped silicon layer on the etch stop layer, forming a semiconductor layer over the doped silicon layer;
forming semiconductor structures comprising one or more p-n junctions at least partially within the semiconductor layer using layering, patterning, and doping steps, wherein the semiconductor structures, semiconductor layer, doped silicon layer, etch stop layer, and initial substrate form an intermediate semiconductor processing structure;
supporting the intermediate semiconductor processing structure with a removable support structure;
removing the initial substrate using a substrate removal process that removes the initial substrate up to the etch stop layer;
removing the etch stop layer with a chemical etching process;
depositing a substrate material on the doped silicon layer to form a base substrate; and
removing the removable support structure.

2. The method of claim 1, wherein forming a semiconductor layer on the doped silicon layer comprises forming an epitaxial layer on the doped silicon layer.

3. The method of claim 1, wherein providing an initial substrate comprises forming the etch stop layer on the initial substrate having a thickness of between about 1 um and 2 um.

4. The method of claim 3, wherein the etch stop layer comprises silicon dioxide.

5. The method of claim 1, wherein providing a doped silicon layer comprises providing hydrogen atoms to a region of a doped silicon material, wherein the region of the doped silicon material has a sufficient concentration of hydrogen atoms to form a cleavable region.

6. The method of claim 5, wherein the providing hydrogen atoms comprises hydrogen ion implantation.

7. The method of claim 1, wherein providing the doped silicon layer comprises bonding a doped silicon material to the etch stop layer.

8. The method of claim 7, wherein providing the doped silicon layer comprises cleaving the doped silicon material to leave a layer of the doped silicon material disposed on the etch stop layer.

9. The method of claim 8, wherein the cleaving comprises implanting hydrogen into a region of the doped silicon material and annealing the doped silicon material to fracture the doped silicon material along the hydrogen implanted region.

10. The method of claim 1, wherein supporting the intermediate semiconductor processing structure with the removable support structure comprises temporarily bonding the removable support structure to the semiconductor structures.

11. The method of claim 1, wherein removing the initial substrate comprises grinding a portion of the initial substrate away to a predetermined thickness.

12. The method of claim 11, further comprising chemically etching the initial substrate from the etch stop layer.

13. The method of claim 1, wherein depositing the substrate material on the doped silicon layer to form a base substrate comprises depositing a metal layer on and in contact with the doped silicon layer.

14. The method of claim 1, wherein providing the doped silicon layer on the etch stop layer comprises providing a heavily doped silicon layer on the etch stop layer.

15. A method of forming semiconductor structures on a metal substrate, the method comprising:
   providing an initial substrate with an exposed silicon dioxide layer;
   bonding a hydrogen implanted doped silicon material to the silicon dioxide layer, the hydrogen implanted doped silicon material having a region sufficiently weakened by the hydrogen to allow cleaving the hydrogen implanted doped silicon material along the weakened region;
   cleaving the hydrogen implanted doped silicon material along the weakened region leaving a doped silicon layer bonded to the silicon dioxide layer;
   after leaving the doped silicon layer bonded to the silicon dioxide layer, forming a semiconductor layer over the doped silicon layer;
   forming semiconductor structures at least partially within the semiconductor layer;
   supporting the semiconductor structures, silicon dioxide layer, and initial substrate with a supporting device;
   removing the initial substrate;
   removing the silicon dioxide layer; and
   providing a sufficient amount of metal to the doped silicon layer to form a metal substrate.

16. The method of claim 15, wherein forming a semiconductor layer comprises forming an epitaxial layer on the doped silicon layer.

17. The method of claim 15, wherein cleaving the hydrogen implanted doped silicon material comprises annealing the hydrogen implanted doped silicon material sufficiently to separate the doped silicon layer from the hydrogen implanted doped silicon material.

18. The method of claim 17, wherein annealing the hydrogen implanted doped silicon material comprises heating the weakened region to a temperature of between about 200 to 300 degrees Celsius for about 5 to 10 hours.

19. The method of claim 17, wherein annealing the hydrogen implanted doped silicon structure comprises heating the weakened region to 450 degrees Celsius for about 15 minutes.

20. The method of claim 15, wherein supporting the semiconductor structures, the silicon dioxide layer, and the initial substrate comprises temporarily bonding the supporting device to the semiconductor structures.

21. The method of claim 15, wherein removing the initial substrate comprises grinding the initial substrate to a predefined thickness.

22. The method of claim 15, wherein removing the initial substrate comprises chemically etching the initial substrate using the silicon dioxide layer as an etch stop layer.

23. The method of claim 15, wherein removing the initial substrate comprises forming a soluble material of $SiO_2(OH)^{2-}$.

24. The method of claim 15, wherein providing a sufficient amount of metal comprises electroplating the metal layer to the doped silicon layer.

25. The method of claim 24, wherein the metal layer comprises copper.

* * * * *